United States Patent
Umminger et al.

(10) Patent No.: US 7,382,167 B1
(45) Date of Patent: Jun. 3, 2008

(54) CIRCUIT AND METHOD FOR CONTROLLING HYSTERESIS FOR BILEVEL SIGNAL TRANSITIONS

(75) Inventors: Christopher Bruce Umminger, Mountain View, CA (US); Zhizhong Hou, Fremont, CA (US); James Herr, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 11/102,876

(22) Filed: Apr. 11, 2005

(51) Int. Cl.
*H03K 5/22* (2006.01)
*H03K 5/153* (2006.01)

(52) U.S. Cl. .............. 327/76; 327/75; 327/78
(58) Field of Classification Search ......... 327/50, 327/71–79
See application file for complete search history.

(56) References Cited

U.S. PATENT DOCUMENTS

| | | | | |
|---|---|---|---|---|
| 4,377,779 A | * | 3/1983 | Plunkett | 318/811 |
| 4,418,332 A | * | 11/1983 | Mefford | 340/146.2 |
| 5,142,217 A | * | 8/1992 | Gontowski, Jr. | 323/272 |
| 5,266,884 A | * | 11/1993 | Agiman | 323/284 |
| 5,362,994 A | * | 11/1994 | Lin | 327/72 |
| 5,394,023 A | * | 2/1995 | Gleim et al. | 327/73 |
| 5,404,054 A | * | 4/1995 | Kotowski | 327/73 |
| 5,614,857 A | * | 3/1997 | Lim et al. | 327/205 |
| 6,218,870 B1 | * | 4/2001 | Wilson | 327/34 |
| 6,304,088 B1 | * | 10/2001 | Yee | 324/433 |
| 6,392,446 B1 | * | 5/2002 | Reasoner et al. | 327/20 |
| 6,456,051 B2 | * | 9/2002 | Darzy | 323/284 |
| 6,979,985 B2 | * | 12/2005 | Yoshida et al. | 323/282 |

* cited by examiner

*Primary Examiner*—Dinh T. Le
(74) *Attorney, Agent, or Firm*—McDermott Will & Emery LLP

(57) ABSTRACT

An output signal is controlled with adjustable hysteresis in response to a variable voltage input signal. One or more signals derived from the input signal are respectively compared with first and second reference voltages of different magnitudes. The output signal changes from a first state to a second state when one of the derived signals reaches a first reference voltage level threshold, and changes from the second state to the first state when a second one of the derived signals reaches a second reference level voltage threshold. A first derived signal may be varied to have a voltage magnitude that is greater or lesser than the voltage magnitude of a second derived signal while maintaining a positive hysteresis level. The circuit may be configured to output a signal representing an undervoltage and/or overvoltage condition of the input signal.

14 Claims, 8 Drawing Sheets

PRIOR ART

CIRCUIT AND METHOD FOR CONTROLLING HYSTERESIS FOR BILEVEL SIGNAL TRANSITIONS

TECHNICAL FIELD

The present disclosure relates to the generation of a bilevel state signal with controllable hysteresis, more particularly in the provision of comparator circuitry in which hysteresis can be adjusted externally.

BACKGROUND

A wide variety of circuit applications require reliable generation of bilevel state output signals in response to input conditions. One example is a controller that must allow a circuit board to be safely inserted into and removed from a live backplane. When a circuit board is inserted into a live backplane, large bypass capacitors on the board can draw huge inrush currents from the backplane power bus as they charge. The high current can cause the backplane voltage to dip and can destroy the board's bypass capacitors, metal traces or connector pins. Undervoltage detection and responsive circuit disconnect regulation with precise under-voltage hysteresis is essential to prevent circuit fault damage.

A circuit 10, currently used for undervoltage protection, is shown in FIG. 1. Power supply voltage supply $V_{IN}$ is applied to an input node of a resistive voltage divider circuit comprising series connected resistors 12, 14 and 16. A junction point or node between resistors 12 and 14 is indicated by INH. A junction point or node between resistors 14 and 16 is indicated by INL. Normally open switch contact 18 is connected between INH and a negative input of comparator 20. Normally closed contact 19 is connected between INL and the negative input of the comparator. For explanatory purposes only, voltages VEXT and VINH, which respectively represent the voltages across resistors 14 and 12, are illustrated. A reference voltage REF is connected to the positive input of the comparator. The output of comparator 20 is applied to a relay or the like, not shown, that simultaneously controls operation of both switch contacts in response to the comparator output. While a well-known relay and switch are exemplified, this arrangement may represent known equivalent electronic switches and control circuits therefor.

The comparator output produces a bilevel state signal that can function as a switch signal to a controller connected thereto. A high level state of the comparator output indicates that the supply voltage $V_{IN}$ has decreased to an undesirable level. In response to this state, a controller can initiate appropriate disconnect protection. During normal supply voltage conditions, the comparator output assumes a low level state.

During normal level voltage supply conditions, as illustrated, switch 19 connects INL to the negative comparator input while switch 18 is open. As INL voltage is greater than REF, the comparator output is at a low level state. If $V_{IN}$ decreases, INL decreases proportionately. When INL voltage decreases to REF, the level at which $V_{IN}$ reaches an undesirable level, the comparator output changes to a high state, effecting a turn-off signal. In response to the high level comparator output, the comparator input switch contacts are activated to open switch contact 19 and close switch contact 18. At this time, the negative input of the comparator is connected to INH. The voltage VINH is a smaller fraction of $V_{IN}$ than the voltage at INL, and thus lower than, the INL voltage. As a result of the switch actuation, the voltage at the negative input of the comparator has decreased by VEXT, the voltage across resistor 14. The comparator will continue to output a high level state signal until the voltage at VINH rises to REF to change the output back to the low level state. At this time, the voltage at INL exceeds REF by the voltage across resistor 14. The voltage of $V_{IN}$ is higher than the $V_{IN}$ undervoltage threshold at which the comparator is activated to a high state output.

The circuit thus provides a hysteresis switching function. A high output is produced when the supply voltage decreases to a low voltage threshold and a low output is produced when the supply voltage exceeds a threshold that is higher than the low voltage threshold. That is, even if the supply voltage is increased from below the low voltage threshold, the output will not change state until the supply voltage increases further by the hysteresis value. The hysteresis value corresponds to VEXT, which is determined by the voltage divider circuit, particularly the value of resistor 14. Hysteresis can be adjusted externally by changing the value of resistor 14. The provision of hysteresis limits oscillation of the output signal between states when the supply voltage is close to the low threshold level.

A disadvantage of the circuit just described is that the voltage taps INL and INH can be inadvertently misconnected to the comparator input such that switch 18 is connected to INL and switch 19 is connected to INH. With such interconnections, the negative comparator input is coupled through switch 19 to INH during nominal $V_{IN}$ levels. As VINH exceeds REF, the comparator output is low. The output remains at the low state until VINH decreases to the threshold REF. The comparator changes output states to a high level, which then activates the switch to open contact 19 and close contact 18. As the resistor divider circuit has been improperly connected, the negative comparator input is now connected to INL. As the voltage at INL at this time exceeds VINH and REF by VEXT, the comparator again changes states to the low level resulting again in a change in switch contact states. Operation of the circuit becomes unstable with continuous oscillation of the states of the comparator output.

The need thus exists for a comparator circuit that has precise default hysteresis that can also be adjusted externally without risk of oscillation.

SUMMARY OF THE DISCLOSURE

The subject matter described herein fulfills the above-described needs of the prior art. An output signal is controlled with adjustable hysteresis in response to a variable voltage input signal that may, for example, be the voltage of a power supply. One or more signals derived from the input signal are respectively compared with first and second reference voltages of different magnitudes. The output signal changes from a first state to a second state when the derived signal decreases to below the first reference voltage of lower magnitude, and changes from the second state to the first state when the derived signal increases to above the second reference voltage of higher magnitude.

The derived signal may be a single signal that is proportional to the variable voltage input signal and used for comparison with each of the reference voltages. The hysteresis value is thus determined by the difference between the first and second reference voltages, which set the thresholds for changing output signal states.

A second signal may be derived from the input signal that is proportional thereto but at a different ratio than the first derived signal, for example, at a lower value than the first derived signal. The hysteresis value of the output state control is determined not only by the difference between the first and second reference voltages but also in accordance with the difference between the first and second signal voltages. By adjusting the first and second ratios the hysteresis of the output signal control can be varied.

In one aspect of the disclosure, a circuit includes a first comparator having a first input coupled to the variable voltage input and a second input coupled to the first reference threshold voltage, and a second comparator having a first input coupled to the variable voltage input and a second input coupled to a second reference threshold voltage. A logic circuit is coupled to outputs of the first and second comparators. The bilevel voltage state of the logic circuit is controlled in response to the comparator outputs. The logic circuit output changes from a first state to a second state in response to the voltage at the first comparator input decreasing below the voltage level of the first reference threshold, and the logic circuit changes from the second state to the first state in response to the voltage at the second comparator input increasing above the voltage level of the second reference threshold.

A voltage divider circuit coupled to the variable voltage contains one or more circuit points at different fractional voltages of the variable input voltage, to be coupled to the first inputs of the comparators. The first inputs of both comparators may be directly connected to each other and to a single voltage divider circuit point, whereby the hysteresis is set equal to the difference between the reference voltages. Alternatively, the first comparator input may be coupled to a first junction between resistive elements of the voltage divider circuit and the second comparator input coupled to a second junction between elements of the voltage divider circuit. In the latter case, hysteresis can be adjusted by varying the resistance between junctions.

The outputs of the first and second comparators are coupled to inputs of a first AND gate. Inverted outputs of the first and second comparators are coupled to inputs of a second AND gate. A latch circuit has a set input coupled to the output of the first AND gate, a reset input coupled to the output of the second AND gate, and an output from which the hysteresis circuit bilevel voltage output signal is taken.

In another aspect of the disclosure, a comparator has a first input selectively coupled to a first reference voltage or a second reference voltage through respective switches. A second input of the comparator is selectively coupled to a first circuit point of the voltage divider circuit or a second circuit point of the voltage divider circuit through respective switches. The switches are controlled simultaneously. Whenever the first comparator input is connected by a switch to the first reference voltage, the second comparator input is connected to one of the voltage divider circuit points. Whenever the first comparator input is connected by a switch to the second reference voltage, the second comparator input is connected to the other of the voltage divider circuit points. A logic circuit is coupled to the comparator output. An AND gate has one input directly connected to the comparator output and a second input connected to the comparator output through a delay circuit. The AND gate output produces the bilevel state output voltage. A flip-flop circuit is coupled to the comparator, the AND gate, and the switches for outputting a switch control signal in response to the comparator output and AND gate output.

Additional advantages will become readily apparent to those skilled in this art from the following detailed description, wherein only the preferred embodiments are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Implementations of the present invention are illustrated by way of example, and not by way of limitation, in the figures of the accompanying drawings and in which like reference numerals refer to similar elements.

DETAILED DESCRIPTION

Figure 1:
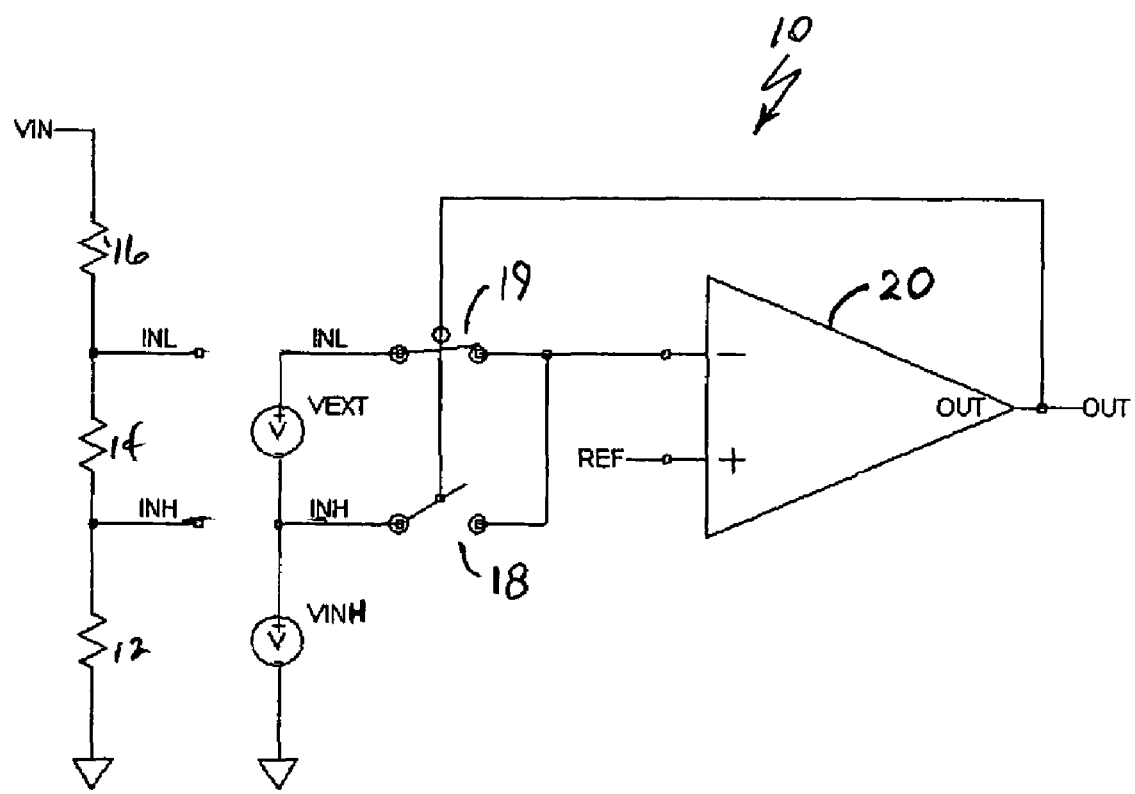
FIG. 1 is a circuit diagram of a hysteresis circuit of the prior art.
Figure 2:
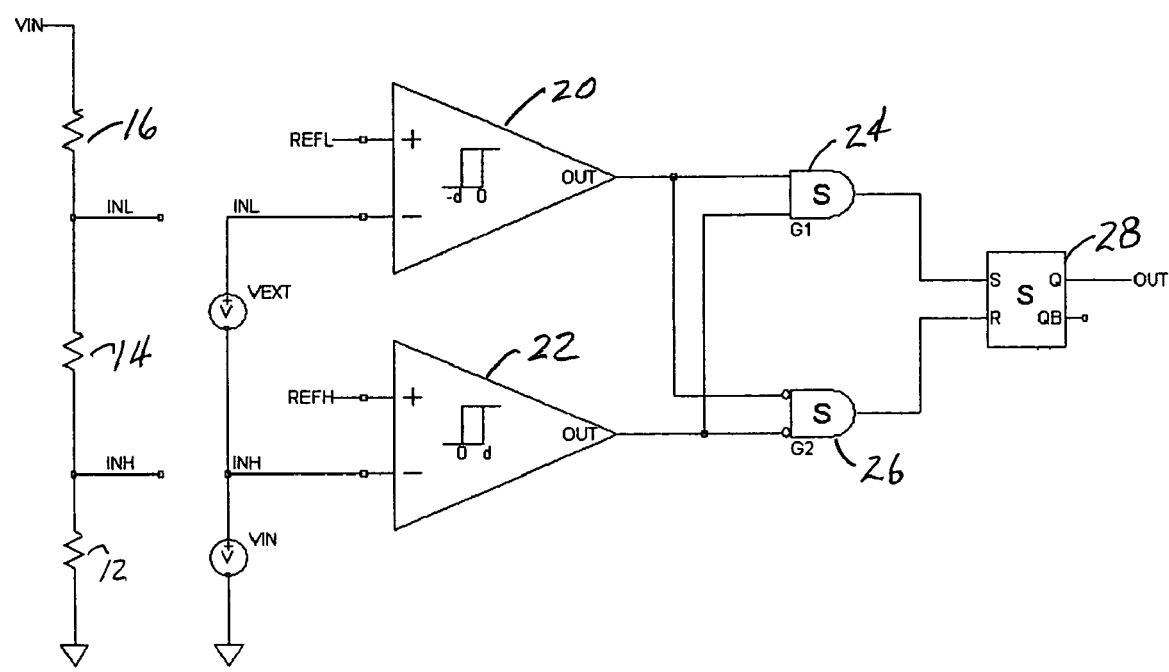
FIG. 2 is a circuit diagram of a hysteresis circuit in accordance with the present invention.

FIG. 2 is a circuit diagram of a hysteresis circuit in accordance with an exemplary embodiment of the present invention. In response to variations of voltage supply $V_{IN}$ between normal and undervoltage conditions, the output transitions between states with a level of hysteresis that can be adjustable. $V_{IN}$ is applied to an input node of a resistive voltage divider circuit comprising series connected resistors 12, 14 and 16. A negative input of comparator 20 is connected to the voltage divider circuit point INL, the junction between resistors 14 and 16. A negative input of comparator 22 is connected to the voltage divider circuit point INH, the junction between resistors 12 and 14. The positive input of comparator 20 is coupled to reference voltage REFL. The positive input of comparator 22 is coupled to reference voltage REFH. The outputs of comparators 20 and 22 are coupled to respective inputs of AND gate 24. Inverted outputs of comparators 20 and 22 are coupled to respective inputs of AND gate 26. The output of AND gate 24 is connected to the set input of latch 28. The output of AND gate 26 is connected to the reset input of latch 28.

REFH is greater than REFL. Reference voltage REFL sets a trip voltage to comparator 20. Comparator 20 has an internal hysteresis with a negative offset d on the falling edge to set a precise turn-on threshold. Reference voltage REFH sets a trip voltage to comparator 22. Comparator 22 has an internal hysteresis with a positive offset d on the rising edge to set a precise turn-off threshold. The hysteresis d is typically small, on the order of 10 mV, and may be inaccurate. The logic circuit ensures that INH and INL cross their thresholds for the output (OUT) to change state.

The voltage divider can be adjusted so that INL and INH are connected to the same point, effectively setting resistance of resistor 14, and thus VEXT, to zero. Operation with such configuration is as follows. When the supply voltage is at a nominal high level, INL exceeds REFL and INH exceeds REFH. The outputs of both comparators 20 and 22 are thus at a low output state. Gate 24 outputs a low state to the set input of latch 28, gate 26 outputs a high state to the reset input of latch 28, and the output of latch 28 is at a low state. As the input voltage decreases, the negative comparator inputs (with INL equal to INH) first reach the REFH threshold before reaching the REFL threshold. Upon reaching the REFH threshold, the output of comparator 22 will change to a high state, while the output of comparator 20 remains at a low state. As each of AND gates 24 and 26 have inputs of different states, both AND gates output a low state signal and the output of latch 28 remains at the low state. Upon reaching the REFL threshold, the output of comparator 20 will change to a high state, while the output of comparator 22 remains at a high state. AND gate 24 now changes its output to a high state to set the latch, while the output of AND gate 26 remains at the low state. The output of latch 28 has changed to a high state.

When the input voltage increases back to nominal value, the negative comparator inputs first reach the REFL threshold before reaching the REFH threshold. Upon reaching the REFL threshold, the output of comparator 20 will change to a low state, while the output of comparator 22 remains at a high state. As each of AND gates 24 and 26 have inputs of different states, both AND gates output a low state signal and the output of latch 28 remains at the high state. Upon reaching the REFH threshold, the output of comparator 22 will change to a low state, while the output of comparator 20 remains at a low state. The output of AND gate 24 remains at the low state, while the output of AND gate 26 changes to the high state to reset the latch 28 to change its output to a low state.

Figure 3:
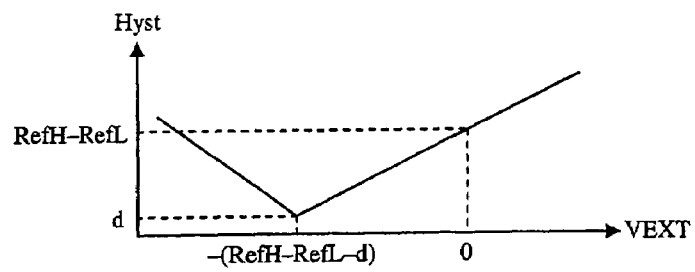
FIG. 3 is a diagram showing adjustment of hysteresis as a function of variation of input voltages of the comparators of FIG. 2.

The effects of changing VEXT over a positive and negative range is shown in FIG. 3. If INH and INL are tied together, VEXT is zero and the comparator has an accurate default hysteresis set by the two reference voltages.

$$Hyst(\text{default})=REFH-REFL \text{ when } VEXT=0$$

If INL is placed above INH in the resistive divider, VEXT becomes greater than zero. When INH has increased to the REFH threshold level, INL is at a level equal to REFH plus VEXT. The hysteresis is thus greater than the default hysteresis and increases with increasing VEXT.

$$Hyst=REFH-REFL+VEXT$$

When VEXT=−(REFH−REFL−d), the hysteresis reaches a minimum equal to the built-in hysteresis of each internal comparator; Hyst(min)=d. When VEXT goes more negative, the hysteresis will begin increasing again so oscillation is avoided. The overall hysteresis will now be slightly less accurate since it is a function of the built-in hysteresis d of the individual comparators. In general, the hysteresis is an absolute value function of VEXT.

$$Hyst=|VEXT+(REFH-REFL-d)|+d$$

Figure 4:
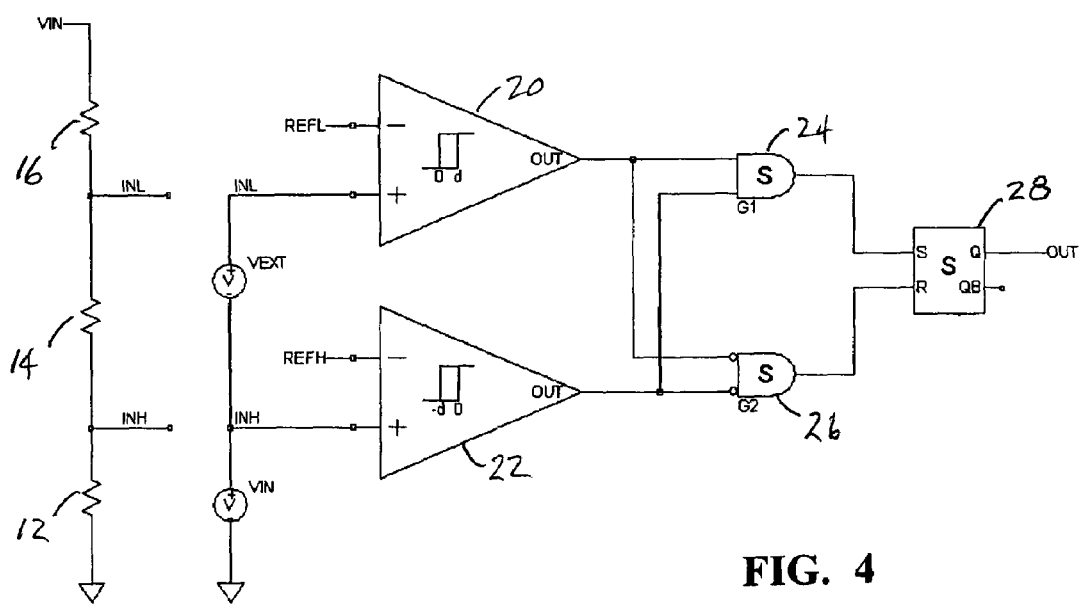
FIG. 4 is a circuit diagram of a variation of the circuit of FIG. 2.

The circuit of FIG. 2 can be modified to be responsive to variations of power supply voltage supply $V_{IN}$ between normal and overvoltage conditions, as shown in FIG. 4. The negative inputs of comparators 20 and 22 receive, respectively, the reference voltages REFL and REFH. INL is applied to the positive input of comparator 20. INH is applied to the positive input of comparator 22. Comparator 20 has an internal hysteresis with a positive offset d. Comparator 22 has an internal hysteresis with a negative offset d.

Figure 5:
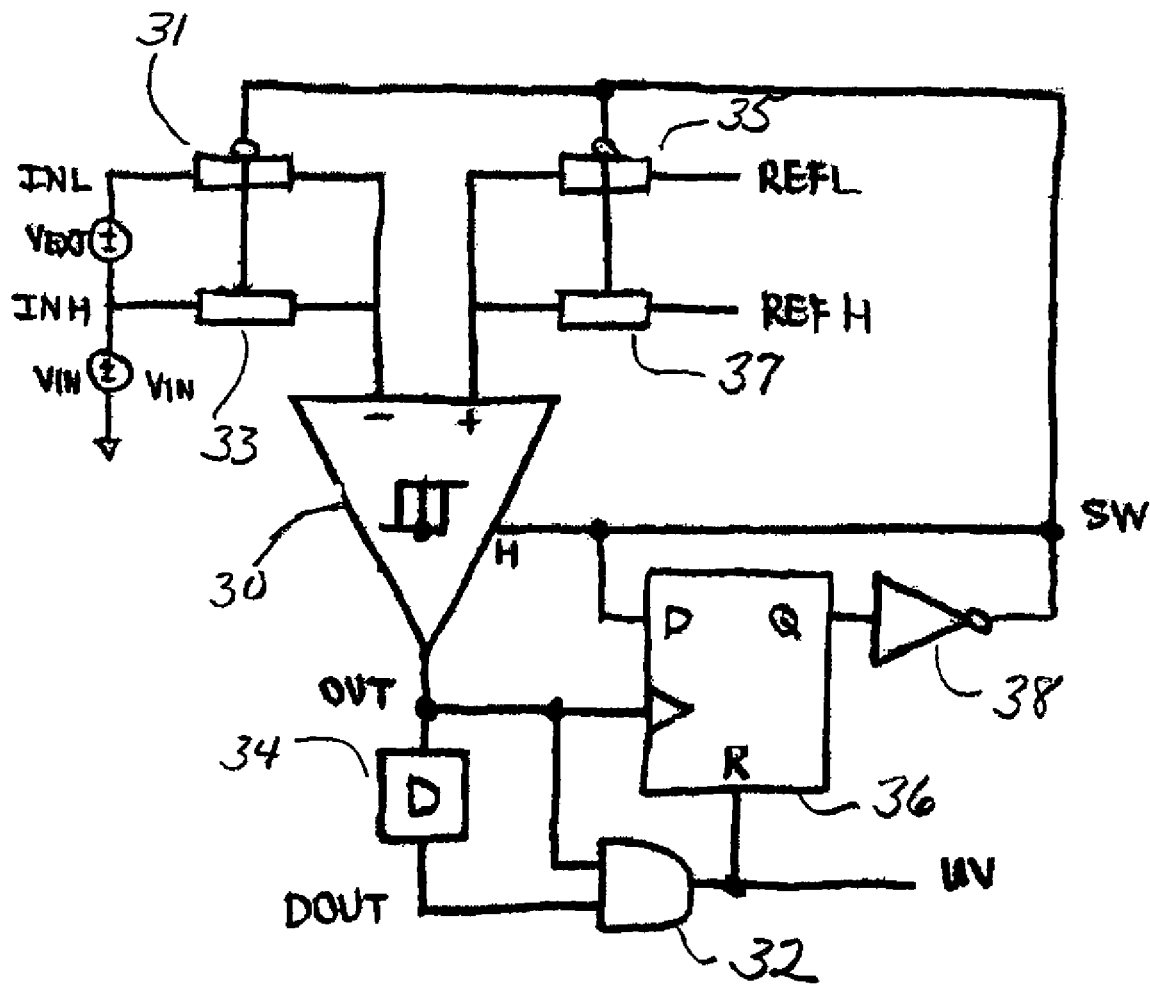
FIG. 5 is a circuit diagram of another hysteresis circuit in accordance with the present invention.
Figure 6:
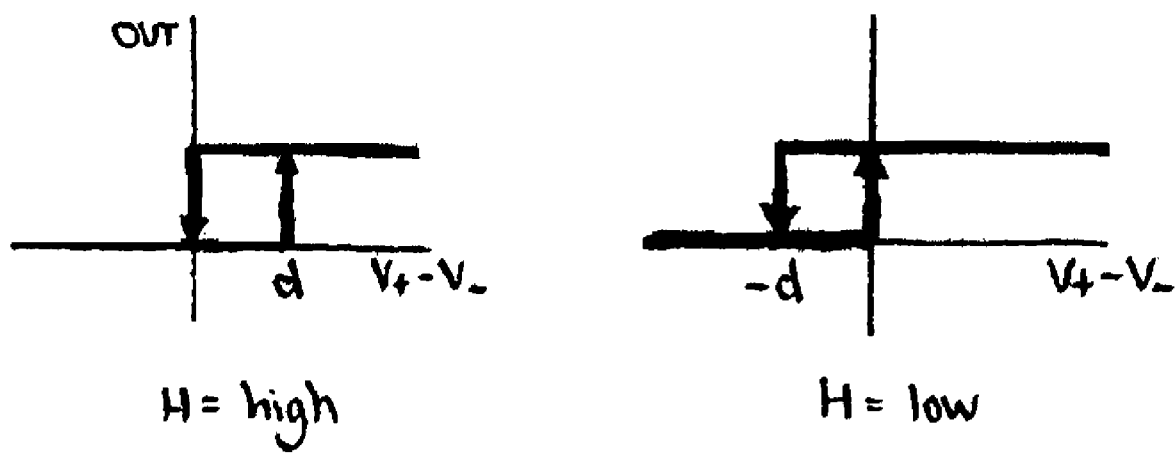
FIG. 6 is a waveform diagram of hysteresis curves for the internal hysteresis of the comparator of FIG. 5.

FIG. 5 is a circuit diagram of another hysteresis circuit that transitions its output state in response to variations of the supply voltage between normal and undervoltage conditions. The negative input of comparator 30 is coupled to INL via switch 31 and coupled to INH via switch 33. Comparator 30 has inherent hysteresis as illustrated in the diagrams of FIG. 6. H represents a signal received from line SW. The power supply node and voltage divider, similar to that of FIG. 2, has not been shown for ease of illustration. The positive input of comparator 30 is coupled to voltage reference REFL via switch 35 and coupled to voltage reference REFH via switch 37. REFH is greater than REFL. Switches 31, 33, 35, and 37 may be well-known controlled switches that are activated or deactivated in accordance with the signal on line SW. The switches are configured so that switches 33 and 37 commonly assume the same state while switches 31 and 35 commonly assume the opposite state.

The output of comparator 30 is directly coupled to a first input of AND gate 32 and coupled through delay circuit 34 to a second input of AND gate 32. The output of AND gate 32 produces the circuit output signal UV, indicative of undervoltage condition. The output of comparator 30 is also fed to the clock input of flip-flop 36. The output of AND gate 32 is also fed to the reset of flip-flop 36. The output of flip-flop 33 is connected to inverter 38 that produces the signal on line SW.

Figure 7A:
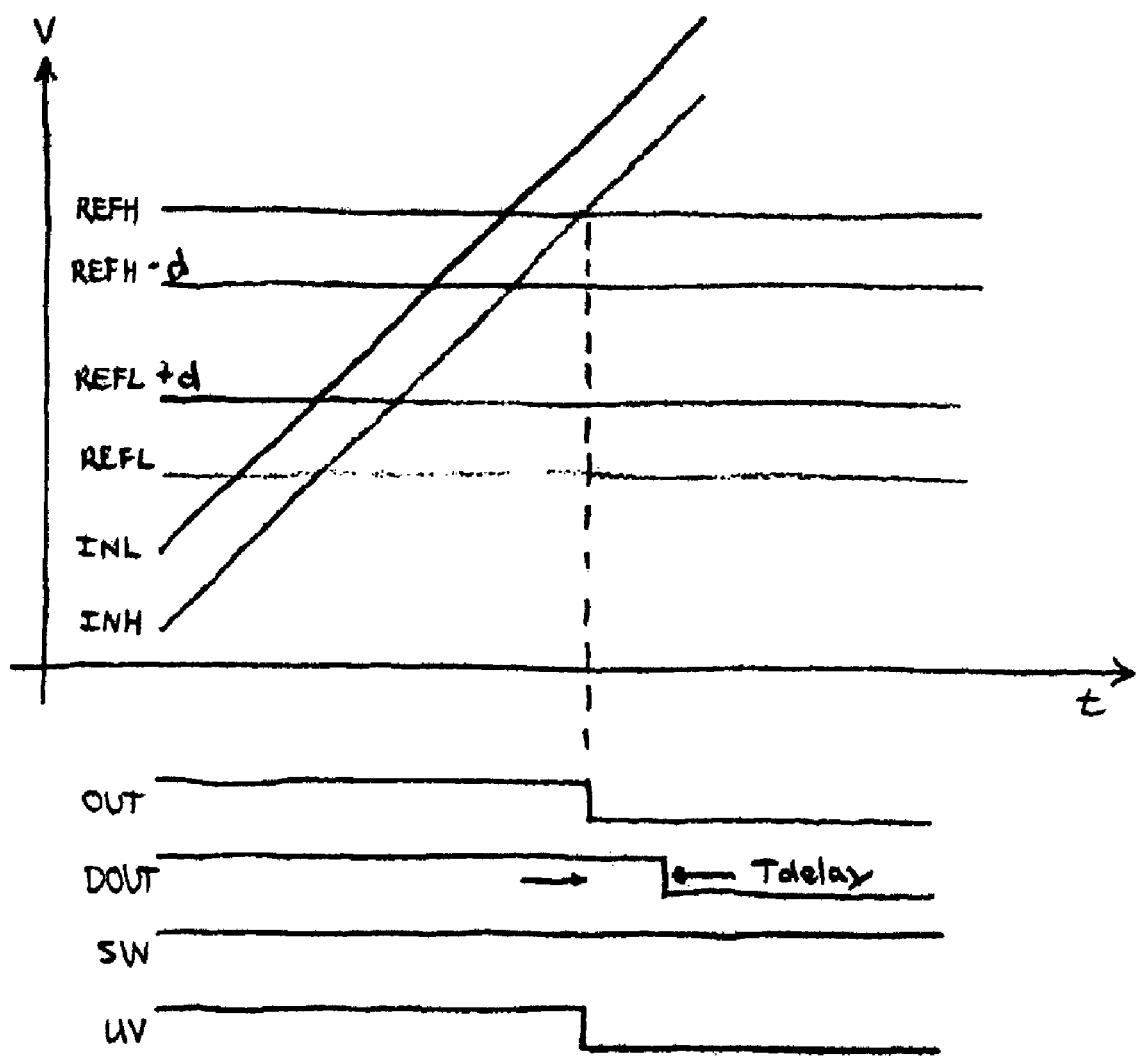
FIGS. 7(a) through 7(c) are time diagrams for the operation of the circuit of FIG. 5.

Operation of the circuit is described with reference to FIGS. 7(a)-7(c). FIG. 7(a) illustrates the detection of the upper threshold. It is initially assumed that VEXT is greater than zero. Voltages INL and INH are less than REFL and REFH, respectively. Comparator 30 output (OUT) is high, both inputs to AND gate 32 are high and the UV output is high, indicating an undervoltage condition. The flip-flop is held in reset with its Q output low. The inverted output on line SW is high. The comparator hysteresis is configured to have a positive offset d on the rising edge of the signal on line SW and switches 33 and 37 connect INH and REFH to the negative and positive comparator inputs, respectively.

As $V_{IN}$ rises, so will INL and INH. When INH becomes equal to REFH, the comparator output will go low to drive output UV, the output of AND gate 32, low. This action defines the upper trip point of the undervoltage circuit when INH=REFH.

Figure 7B:
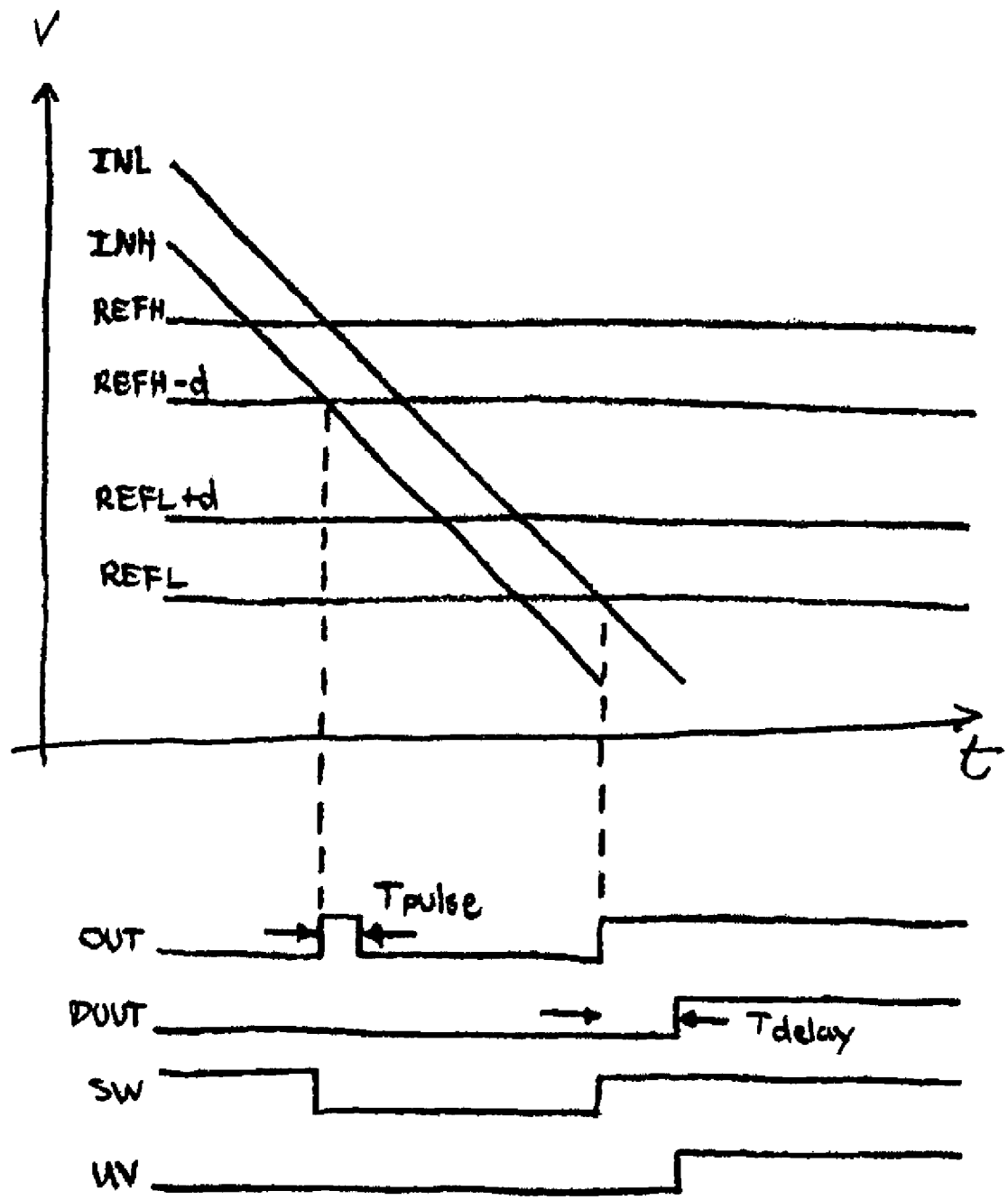

Operation during the decreasing condition of $V_{IN}$ is illustrated in FIG. 7(b). When INH decreases to the level REFH−d, the comparator output again goes high, where d is the offset of the rising edge hysteresis. The rising edge of the comparator output will clock the flip-flop and toggle its output high and the node SW low. When SW goes low, switches 33 and 37 will be turned off and switch 31 and 35 will be turned on. INL and REFL will be connected to the negative and positive comparator inputs, respectively.

If at this point INL>REFL (when VEXT>−(REFH−REFL)+d), the comparator output will go low again. The high pulse on the comparator output will be limited in duration to the propagation time of these signals through the logic, switches, and comparator. The delay circuit 34 will prevent AND gate 32 from reacting to this comparator output pulse, so that the output UV remains low. When $V_{IN}$ decreases further to the point where INL=REFL, the comparator output will go high again. The rising edge of the comparator output will clock the flip-flop and toggle its output low and the line SW high. Switches 31 and 35 will turn off and switches 33 and 37 will turn on to again connect INH and REFH to the negative and positive comparator inputs, respectively. Since INH<REFH at this point, the comparator output will remain high. After the delay, the second input to AND gate 32 will go high to indicate a return to the undervoltage condition. This action defines the lower trip point of the undervoltage circuit when INL=REFL. The total hysteresis of this circuit will be equal to REFH−REFL+VEXT.

Figure 7C:
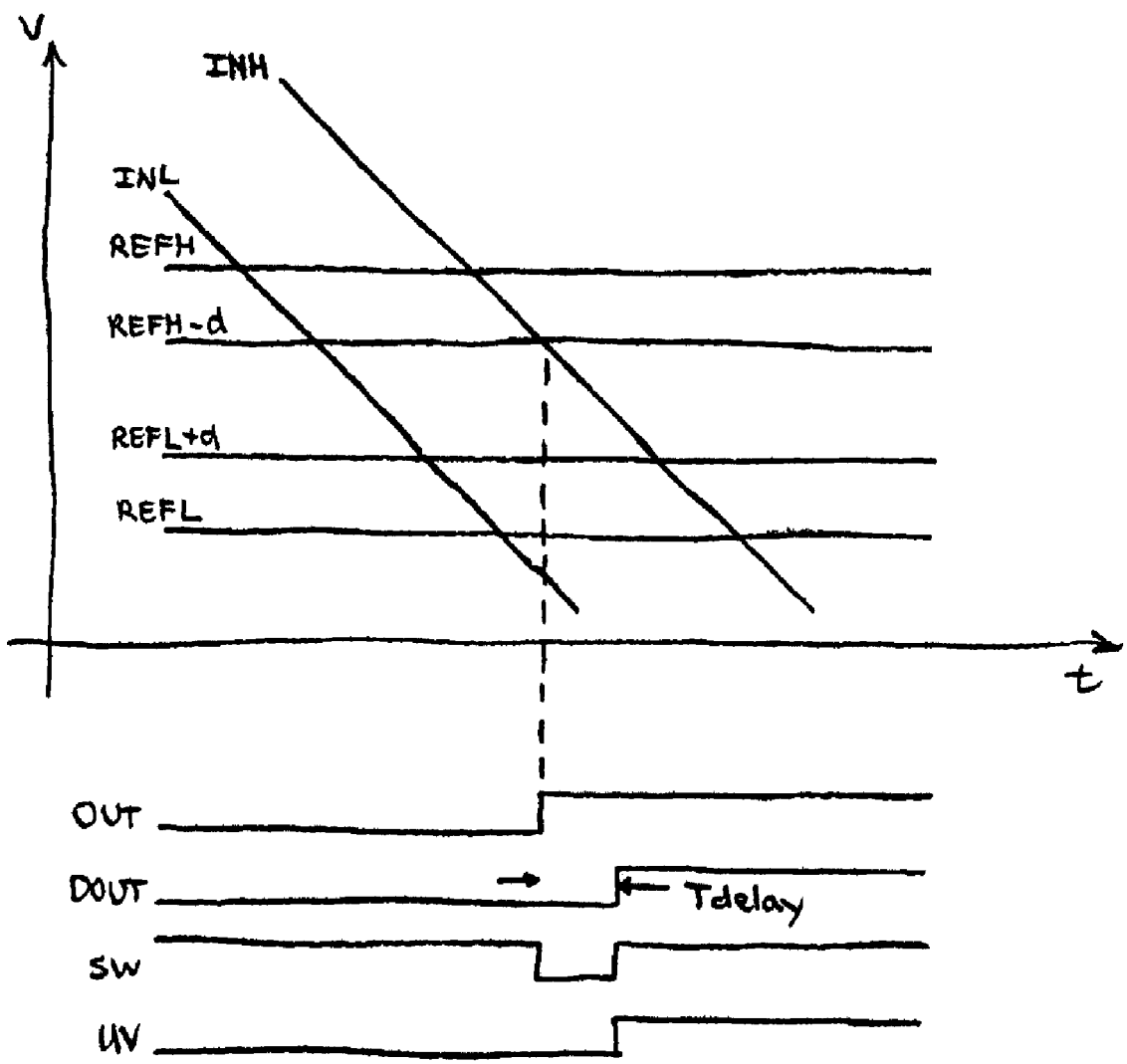

FIG. 7(c) illustrates the case when INL<REFL when INH=REFH−d as $V_{IN}$ decreases. When SW goes low, the comparator output will remain high. After the delay, the second input to AND gate 32 will go high and the output will go high to indicate a return to the undervoltage condition. The flip-flop will be reset to low and the line SW high. Switches 31 and 35 will turn off and switches 33 and 37 will turn on to again connect INH and REFH to the negative and positive comparator inputs, respectively. This action defines the lower trip point of the undervoltage circuit when INH=REFH−d. The total hysteresis of this circuit will be equal to d in this case. Thus, this circuit hysteresis is related to the comparator input parameters in the following manner.

HYST=REFH−REFL+VEXT when VEXT>−(REFH−REFL)+d

HYST=d when VEXT<−(REFH−REFL)+d

With the implementation of the circuit of FIG. 5, a single comparator can be used for both the upper and lower trip points. The implementation saves circuit area and makes it easier to design a low offset circuit since only one low offset comparator is required. The hysteresis can be set to an accurate built-in level of REFH−REFL when the inputs INL and INH are connected together. The hysteresis can be adjusted upwards and downwards, but not below a minimum value of d that prevents the circuit from oscillating. The circuit increases the delay as compared with the operation of the FIG. 2 circuit, due to the delay circuit. A more complex comparator with hysteresis that can be switched from rising to falling edges is required for the FIG. 5 circuit.

In this disclosure there are shown and described only preferred embodiments of the invention and but a few examples of its versatility. Various modifications of the described circuits are envisioned as being applicable to the concepts described. For example, in the circuit of FIG. 5, the delay may be moved from the UV rising edge to the UV falling edge. Alternatively, a circuit can be figured with adjustable hysteresis that is susceptible to oscillations and then detect or filter the oscillations to generate a stable output. Oscillations could be prevented by other means, such as detecting with a third comparator that INL is too far below INH and taking action to avoid oscillation. Such action might be to force the circuit output into a known state under this condition.

It is to be understood that the invention is capable of use in various other combinations and environments and is capable of changes or modifications within the scope of the inventive concept as expressed herein. Comparators with hysteresis are used in a wide variety of applications. The disclosed circuits can be used with a −48V hot Swap™ controller, such as the LTC4253 controller manufactured by Linear Technology, Inc., or in hot swap controllers for other voltages. The disclosed comparators can be utilized in power supplies and power converters that need a precise undervoltage or overvoltage shutdown with hysteresis. Their use is applicable to supply monitors or supervisors monitoring under and/or overvoltage. The disclosed circuits are applicable to comparators that monitor parameters other than voltage, such as current.

What is claimed is:

1. A switched hysteresis circuit comprising:
an input node coupled to receive a variable voltage input;
a first comparator having a first input coupled to the input node to receive a first voltage proportional to the voltage at the voltage input, and a second input coupled to receive a first reference threshold voltage;
a second comparator having a first input coupled to the input node to receive a second voltage proportional to the voltage at the voltage input and different from the first voltage, and a second input coupled to receive a second reference threshold voltage different from the first reference threshold voltage; and
a logic circuit including a circuit for performing a logical AND function and coupled to outputs of the first and second comparators, the logic circuit having a bilevel state voltage output, the state of the logic circuit output being controlled in response to the outputs of the comparators to provide an adjustable level of hysteresis,
the logic circuit output changing from a first logic state to a second logic state when both the first and second voltages are above a highest voltage among the first and second reference threshold voltages, and
the logic circuit output changing from the second logic state to the first logic state when both the first and second voltages are below a lowest voltage among the first and second reference threshold voltages.

2. A switched hysteresis circuit as recited in claim 1, wherein the first inputs of both comparators are connected to each other through a voltage dropping element.

3. A switched hysteresis circuit as recited in claim 1, further comprising a voltage divider circuit coupled between the input node and both comparators, the voltage divider circuit comprising a plurality of nodes respectively exhibiting different fractional voltages of the variable input voltage.

4. A switched hysteresis circuit as recited in claim 3, wherein the first input of the first comparator is coupled to a first said node of the voltage divider circuit and the first input of the second comparator is coupled to a second said node of the voltage divider circuit.

5. A switched hysteresis circuit as recited in claim 4, wherein the voltage divider comprises a plurality of resistors, the first said node comprises a junction between a first pair of resistors and the second said node comprises a junction between a second pair of resistors, and the resistance between the first node and the second node is adjustable, whereby the range of hysteresis of the switching circuit is varied in accordance with resistance adjustment.

6. A switched hysteresis circuit comprising:
an input node coupled to receive a variable voltage input;
a first comparator having a first input coupled to the input node to receive a first voltage proportional to the voltage at the voltage input, and a second input coupled to receive a first reference threshold voltage;
a second comparator having a first input coupled to the input node to receive a second voltage proportional to the voltage at the voltage input and different from the first voltage, and a second input coupled to receive a second reference threshold voltage different from the first reference threshold voltage; and
a logic circuit coupled to outputs of the first and second comparators, the logic circuit having a bilevel state voltage output, the state of the logic circuit output being controlled in response to the outputs of the comparators to provide a level of hysteresis, wherein the logic circuit comprises:
- a first AND gate having inputs respectively coupled to the outputs of the first and second comparators;
- a second AND gate having inputs respectively coupled to inverted outputs of the first and second comparators; and
- a latch circuit having a set input coupled to the output of the first AND gate, a reset input coupled to the output of the second AND gate, and an output coupled to the hysteresis circuit bilevel voltage output;
- the logic circuit output changes from a first logic state to a second logic state when both the first and second voltages are above a highest voltage among the first and second reference threshold voltages, and
- the logic circuit output changes from the second logic state to the first logic state when both the first and second voltages are below a lowest voltage among the first and second reference threshold voltages.

7. A method of controlling a bilevel output signal with adjustable hysteresis in response to a variable voltage input signal, the method comprising the steps of:
- deriving a first signal related to the variable voltage input;
- comparing the derived first signal with a first reference voltage to produce a first comparison signal;
- deriving a second signal related to the variable voltage input, the derived second signal having a voltage different from the voltage of the derived first signal;
- comparing the derived second signal with a second reference voltage that is different than the first reference voltage to produce a second comparison signal; and
- based on the first and second comparison signals, producing the output signal using a logic circuit including a circuit for performing a logical AND function,
- wherein the first and second signals are derived to provide the adjustable hysteresis of the output signal,
- the output signal changes from a first logic state to a second logic state when voltages of both the first and second signals are above a highest voltage among the first and second reference voltages, and
- the output signal changes from the second logic state to the first logic state when voltages of both the first and second signals are below a lowest voltage among the first and second reference voltages.

8. A method as recited in claim 7, wherein the steps of deriving comprise:
- dividing the variable input signal by first and second ratios to generate the derived first signal and the derived second signal, respectively.

9. A method as recited in claim 8, further comprising the step of adjusting the first and second ratios to vary the hysteresis of the output signal.

10. A method as recited in claim 9, wherein the adjusting step comprises varying the magnitudes of the derived first and second signals so that the
- derived first signal attains a voltage magnitude that is greater or lesser than the voltage magnitude of the derived second signal while maintaining a positive hysteresis level.

11. A switched hysteresis circuit comprising:
- an input node coupled to receive a variable voltage input;
- a comparator having a first input selectively coupled to receive a first reference voltage or a second reference voltage through a first set of respective switches, a second input selectively coupled to the variable voltage input through a second set of respective switches, and an output; and
- a logic circuit coupled to the comparator output, the logic circuit having a bilevel state voltage output, the logic output controlled in response to the comparator output;
- wherein the switches coupled to the first and second comparator inputs are controlled in response to the output of the logic circuit.

12. A switched hysteresis circuit as recited in claim 11, further comprising a voltage divider circuit coupled to the input node; wherein the second input is selectively coupled to a first node of the voltage divider circuit or a second node of the voltage divider circuit through the second set of respective switches.

13. A switched hysteresis circuit as recited in claim 10, wherein the logic circuit comprises:
- a delay circuit having an input coupled to the comparator output; and
- an AND gate having a first input coupled to the delay circuit, a second input coupled to the comparator output, and an output that generates the bilevel state voltage output.

14. A switched hysteresis circuit as recited in claim 11, wherein the logic circuit further comprises a flip-flop circuit coupled to the comparator, the AND gate, and the first and second sets of switches.

* * * * *